United States Patent [19]

Zambrano

[11] Patent Number: 5,679,587
[45] Date of Patent: Oct. 21, 1997

[54] METHOD OF FABRICATING AN INTEGRATED CIRCUIT WITH VERTICAL BIPOLAR POWER TRANSISTORS AND ISOLATED LATERAL BIPOLAR CONTROL TRANSISTORS

[75] Inventor: Raffaele Zambrano, San Giovanni la Punta CT, Italy

[73] Assignee: Consorzio per la Ricerca sulla Microelettronica nel Mezzogiorno, Catania Ct., Italy

[21] Appl. No.: 455,492

[22] Filed: May 31, 1995

Related U.S. Application Data

[62] Division of Ser. No. 908,664, Jul. 2, 1992, Pat. No. 5,565,701.

[30] Foreign Application Priority Data

Jul. 3, 1992 [EP] European Pat. Off. ............ 91830294

[51] Int. Cl.[6] .................................................. H01L 21/265
[52] U.S. Cl. .................... 437/32; 437/31; 437/77; 437/917; 148/DIG. 96
[58] Field of Search ........................... 437/31, 32, 76, 437/77, 917; 148/DIG. 96

[56] References Cited

U.S. PATENT DOCUMENTS

| | | | |
|---|---|---|---|
| 4,110,126 | 8/1978 | Bergeron et al. | 437/32 |
| 4,721,684 | 1/1988 | Musumeci | 437/31 |
| 4,898,836 | 2/1990 | Zambrano et al. | 437/31 |
| 4,965,215 | 10/1990 | Zambrano et al. | 437/31 |
| 5,246,871 | 9/1993 | Zambrano et al. | 437/77 |

*Primary Examiner*—Tuan H. Nguyen
*Attorney, Agent, or Firm*—Robert Groover; Betty Formby; Matthew Anderson

[57] ABSTRACT

An integrated circuit containing both power and small-signal NPN bipolar devices. The small-signal devices use lateral current flow, and are completely surrounded (laterally and vertically) by an N-type well region. The N-type well region itself is completely surrounded (laterally and vertically) by a P-type isolation region. This double isolation provides improved protection against turn-on of parasitic devices, which can cause leakage problems in the conventional device structures. Optionally a self-aligned process step is used to provide a graded base doping profile in the small-signal devices.

24 Claims, 5 Drawing Sheets an overview of smart power
METHOD OF FABRICATING AN INTEGRATED CIRCUIT WITH VERTICAL BIPOLAR POWER TRANSISTORS AND ISOLATED LATERAL BIPOLAR CONTROL TRANSISTORS This is a divisional application of Ser. No. 07/908,664, filed Jul. 2, 1992, now U.S. Pat. No. 5,565,701.

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND OF THE INVENTION

The present invention relates to integrated circuits of the "smart power" type, which include one or more large vertical transistors ("power" devices, capable of handling large currents) together with smaller transistors which can be used to implement complex control circuits.

The device architectures and fabrication technologies used for high-density integrated circuits perform essentially all fabrication steps from a single surface of a monocrystalline silicon wafer. (Such a process may be referred to as a "planar" process.) The transistors fabricated are normally MOS or bipolar. MOS technology provides simpler fabrication and higher density, but bipolar technology provides potentially faster device speed, linearity, and fanout.

Discrete power devices commonly use vertical-current-flow transistors to control large currents with low on-state resistance, while withstanding fairly large voltages. A large variety of device technologies have been proposed for such transistors, including MOS, bipolar, and various hybrids thereof. However, such vertical transistors are inherently difficult to integrate with high density, and may be hard to isolate.

Normal Bipolar Device Structures

Bipolar devices are normally fabricated with a heavily doped n-type emitter region near the surface of the wafer, a thin p-type base region beneath the emitter region, and a large n-type collector region below the base region. (The base region is contacted through a P+ base contact region which is laterally separated from the emitter region, and the collector region is contacted by a front or backside contact which may be widely separated from the emitter contact.) In this device architecture, the thickness of the base region is equal to the difference between the depth of the emitter-base junction and the depth of the base-collector junction. Since both of these junction depths are dependent on diffusion lengths, the process parameters can be controlled to yield a very small base thickness—smaller than could directly be achieved by photolithographic methods. Reduction in the base thickness tends to increase the device gain, and hence is desirable up to a point. However, extreme reduction in the base thickness will also decrease the breakdown voltage of the device.

Some early experimentation used bipolar devices with lateral current flow, and some efforts to provide a complementary bipolar process have used bipolar devices with lateral current flow. However, in general, device architectures with essentially vertical current flow have been greatly preferred for integrated circuits which include bipolar devices.[1]

[1] Some general background may be found in the following books, all of which are hereby incorporated by reference: A. Grove, PHYSICS AND TECHNOLOGY OF SEMICONDUCTOR DEVICES (1967); VLSI TECHNOLOGY (2.ed. Sze 1988); S. Sze, PHYSICS OF SEMICONDUCTOR DEVICES (2.ed. 1981); S. Sze, SEMICONDUCTOR DEVICE, PHYSICS AND TECHNOLOGY (1985); A. Glaser & G. Subak-Sharpe, INTEGRATED CIRCUIT ENGINEERING (1977); A. Milnes, SEMICONDUCTOR DEVICES AND INTEGRATED ELECTRONICS (1980); B. Streetman, SOLID STATE ELECTRONIC DEVICES (3rd ed. 1990); R. Muller & T. Kamins, DEVICE ELECTRONICS FOR INTEGRATED CIRCUITS (1986); and D. Elliott, INTEGRATED CIRCUIT FABRICATION TECHNOLOGY (2nd ed. 1989).

"Smart Power" Integrated Circuits

A large amount of effort has been devoted to integrating high-density small-signal devices on a single integrated circuit with power devices. Such integrated circuits are commonly referred to as "smart power" circuits. However, the incompatibilities between vertical and planar processes have caused many difficulties in achieving such integration.[2] Such integrated circuits are desirable for many applications, including but not limited to linear voltage regulators, switching voltage regulators, AC motor control, fluorescent light ballasts, automotive controls, etc.

[2] Some general review of this class of integrated circuits can be found in POWER INTEGRATED CIRCUITS (ed. Antognetti 1986); Wrathall et al, "Integrated Circuits for the Control of High Power," 1983 IEDM Technical Digest, paper No. 16.1, at pp. 408ff; Baliga, "An overview of smart power technology," 38 IEEE TRANSACTIONS ON ELECTRON DEVICES 1568 (1991), and references cited therein; all of which are hereby incorporated by reference. Reference is also made to Berta et al., "A simplified low-voltage smart power technology," 12 IEEE ELECTRON DEVICE LETTERS 465 (1991).

FIG. 1a shows an example of a conventional "smart power" structure. In the structure of FIG. 1a, the N+ collector contact 3 and the P-type underlying isolation 4 are both formed as buried layers. N-type epitaxial layer 5, contacted by N+ buried layer 3 and n+ sinker diffusion 5a, provides the collector of the small-signal device. N-type substrate 2, and backside N+ diffusion 1, provide the collector of the power transistor. P+ sinker diffusions 6 provide a connection between P+ buried layer 4 and an isolation terminal ISO. FIG. 1b shows an equivalent circuit of this device structure.

SUMMARY OF THE INVENTION

The present application provides an integrated circuit structure which combines large high-current bipolar transistors ("power" devices) with smaller bipolar control transistors. The bipolar control transistor structure provides lateral current flow, and is doubly isolated from the power device. The power and control devices are fabricated together by a novel manufacturing process.

In known monolithic smart power devices the control circuit usually comprises several low voltage npn transistors, laterally separated by p-type isolation regions. (These isolation regions typically connect to a p-type buried layer, shown as layer 4 in FIG. 1a, to complete surround the low voltage transistors.) Unfortunately, this p-type isolation region, together with the collector region of the power transistor and the collector region of a control transistor, defines an npn parasitic transistor. If this parasitic transistor turns on it will bypass the isolation, and may conduct high current and/or voltage into the control circuits. This will cause improper operation operation, and may destroy the integrated circuit.

The present invention provides a new monolithic semiconductor device comprising a control circuit and at least one integrated power transistor in the same chip, which prevents firing of the parasitic npn transistor by minimizing 1) the resistance from its base to ground, and 2) current gain.

According to some innovative embodiments, there is provided an integrated circuit, comprising: one or more small-signal transistors, each comprising an N-type emitter region and an N-type collector region, both located in proximity to a first surface of said integrated circuit, and a P-type base region which is at least partially interposed between said emitter and collector regions; said emitter, base, and collector regions being positioned to define a bipolar transistor having a direction of current flow which is substantially parallel to said first surface of said integrated circuit; said emitter, base, and collector regions being completely surrounded (laterally and vertically) by an N-type well region; and said N-type well region being completely surrounded (laterally and vertically) by a P-type well region; one or more power transistors, each comprising: an N-type emitter region and an N-type collector region; a P-type base region which is at least partially interposed between said emitter and collector regions; said emitter, base, and collector regions being positioned to define a bipolar transistor having a direction of current flow which is substantially perpendicular to said first surface of said integrated circuit; one or more layers of thin-film metallization which interconnect said small-signal and power transistors to realize a predetermined circuit functionality.

According to some innovative embodiments, there is provided an integrated circuit, comprising: one or more small-signal transistors, each comprising an N-type emitter region and an N-type collector region, both located in proximity to a first surface of said integrated circuit, and a P-type base region which is at least partially interposed between said emitter and collector regions, to define a first junction with said emitter region and a second junction with said collector region; said P-type base region having a heavier concentration of P-type dopant atoms in proximity to said first junction than in proximity to said second junction; said emitter, base, and collector regions being positioned to define a bipolar transistor having a direction of current flow which is substantially parallel to said first surface of said integrated circuit; said emitter, base, and collector regions being completely surrounded (laterally and vertically) by an N-type well region; and said N-type well region being completely surrounded (laterally and vertically) by a P-type well region; one or more power transistors, each comprising: an N-type emitter region and an N-type collector region; a P-type base region which is at least partially inter-posed between said emitter and collector regions; said emitter, base, and collector regions being positioned to define a bipolar transistor having a direction of current flow which is substantially perpendicular to said first surface of said integrated circuit; one or more layers of thin-film metallization which interconnect said small-signal and power transistors to realize a predetermined circuit functionality.

According to some innovative embodiments, there is provided an integrated circuit, comprising: one or more small-signal transistors, each comprising an N-type emitter region and an N-type collector region, both located in proximity to a first surface of said integrated circuit, and a P-type base region which is at least partially interposed between said emitter and collector regions; said emitter, base, and collector regions being positioned to define a bipolar transistor having a direction of current flow which is substantially parallel to said first surface of said integrated circuit; a P-type base contact region which adjoins said base region and is more heavily doped than at least some portions of said base region; said emitter and collector regions being completely surrounded (laterally and vertically) by the combination of said base and base contact regions; said base and base contact regions being completely surrounded (laterally and vertically) by an N-type well region; and said N-type well region being completely surrounded (laterally and vertically) by a P-type well region; one or more power transistors, each comprising: an N-type emitter region located in proximity to said first surface, and an N-type collector region located in proximity to a second surface which is opposite said first surface; a P-type base region which is at least partially interposed between said emitter and collector regions; said emitter, base, and collector regions being positioned to define a bipolar transistor having a direction of current flow which is substantially perpendicular to said first surface of said integrated circuit; one or more layers of thin-film metallization which interconnect said small-signal and power transistors to realize a predetermined circuit functionality.

According to some innovative embodiments, there is provided a fabrication method, comprising the steps of: providing a substrate which includes at least one substantially monocrystalline body of semiconductor material, and which has a net N-type doping concentration at at least a first surface thereof; introducing P-type dopant atoms in a predetermined pattern into said substrate to create P-type (buried) regions therein; epitaxially growing an additional thickness of semiconductor material on said first surface, to form an N-type layer overlying said P-type buried regions; introducing and activating dopant atoms, to form at least one P-type guard ring region which extends from said first surface (of said substrate combined with said epitaxial layer) to contact a respective one of said P-type buried regions and totally enclose a respective portion of said N-type layer; introducing and activating dopant atoms, to form at least one N-type guard ring region, within a respective enclosed portion of said N-type layer, which extends from said first surface to a depth less than that of said P-type guard ring regions; introducing P-type dopant atoms, to form at least one base region, within a respective enclosed portion of said N-type layer, which extends from said first surface to a depth less than that of said N-type guard ring regions; and introducing N-type dopant atoms, to form an emitter region, and a collector region laterally separated from said emitter region, within a respective one of said base regions.

The monolithic semiconductor device, in the presently preferred embodiment, comprises integrated in the same chip:

at least one power transistor, a control circuit, a first buried region and second regions joining the first region with the surface of the chip and having a first type of conductivity and acting as insulation regions for the control circuit, a third region of a second type of conductivity opposite the previous one and delimited by the first and second regions and by the surface of the chip, and at least one bipolar transistor with lateral current flow making up part of the control circuit.

The structure of the bipolar transistor with lateral current flow, in the presently preferred embodiment, is characterized, for example, by the presence of:

a fourth region having the first type of conductivity acting as a base region and provided in the third region, a fifth region having the second type of conductivity provided in the fourth region and acting as the collector region, a sixth region having the second type of conductivity provided in the fourth region and acting as the emitter region, a seventh region, with channel-stop function, having the first type of conductivity and more highly doped compared with the fourth region, having annular geometry following the perimeter of the fourth region.

BRIEF DESCRIPTION OF THE DRAWING

The present invention will be described with reference to the accompanying drawings, which show important sample embodiments of the invention and which are incorporated in the specification hereof by reference, wherein:

FIG. 1b shows the equivalent circuit of the structure of FIG. 1a,

DESCRIPTION OF THE PREFERRED EMBODIMENT

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1A:
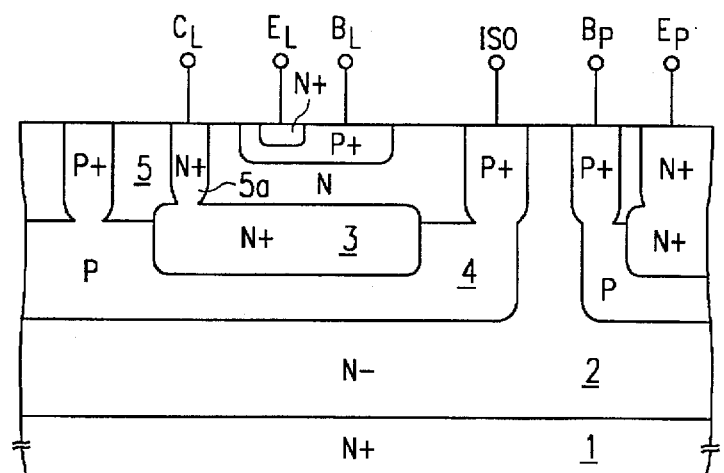
FIG. 1a shows the structure of a monolithic semiconductor device in accordance with the known art.

A structure of a monolithic semiconductor device in accordance with the known art is shown in FIG. 1a. For the sake of simplicity, this Figure shows only a single component of the control circuit (a low voltage npn transistor with vertical current flow), and a single power transistor (also an npn transistor).

Figure 1B:
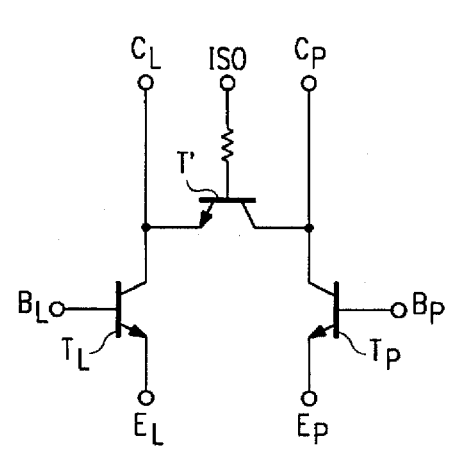

FIG. 1b shows the electrical equivalent of the above structure. In addition to the transistor $T_P$ and the transistor $T_L$ of the control circuit it shows the npn parasitic transistor T' (whose collector, base and emitter regions are made up respectively of the regions 1+2, 4, and 3+5+5a), which are typical of the insulation structure, and the resistance between its base and the insulation terminal ISO, which is generally grounded.

It is therefore necessary to prevent this transistor from turning on (forward or reverse). For this purpose it is necessary to minimize:

resistance between the base of the transistor and the insulation terminal of the monolithic device (which is normally grounded); and its current gain.

The magnitudes of these two values are both typically rather high, and they cannot be sufficiently reduced by optimization of the process parameters.

Figure 2:
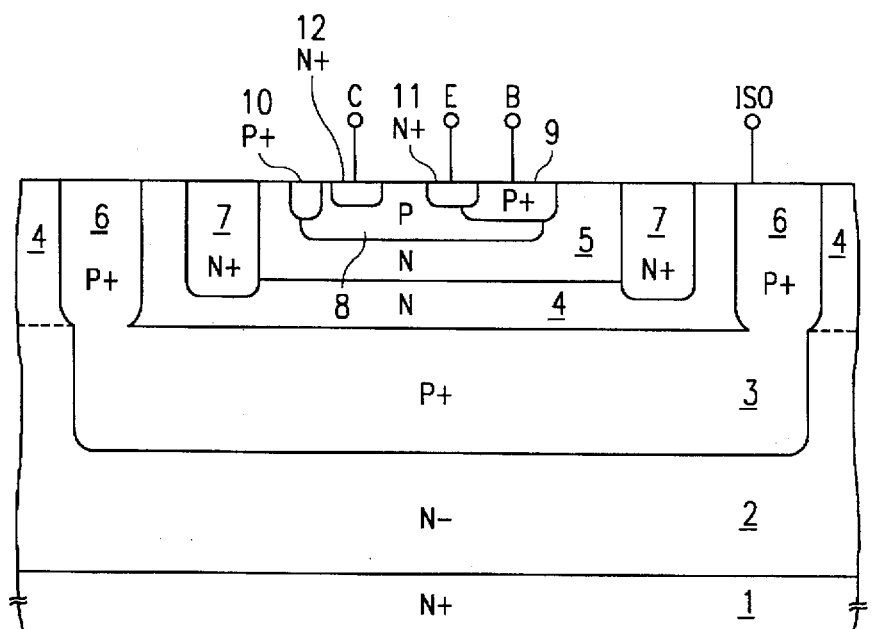
FIG. 2 shows the structure of a first example of a monolithic semiconductor device in accordance with the present invention.

As may be seen in FIG. 2, in which the power transistor is not shown, a structure in accordance with the present invention differs from the known one of FIG. 1 in several respects. One important difference is that the buried type N layer (buried layer 3 of FIG. 1a) has been elimintated. Another difference is that the npn transistor of the control circuit has horizontal current flow instead of vertical (as in the npn transistor of FIG. 1a).

The process sequence according to the present invention is shown schematically in FIGS. 3 to 6. For the sake of simplicity, these Figures show a detailed view of a single component of the control circuit (a low voltage npn transistor). The sequence consists of:

I. The starting material is an N+-doped monocrystalline silicon substrate 1 (seen in FIG. 3). In the presently preferred embodiment, this substrate is doped with As or Sb to a bulk resistivity of about 20 mΩcm, but of course other doping levels can be used.

II. Epitaxial growth of an N-type layer 2 on the substrate 1 (seen in

Figure 3:
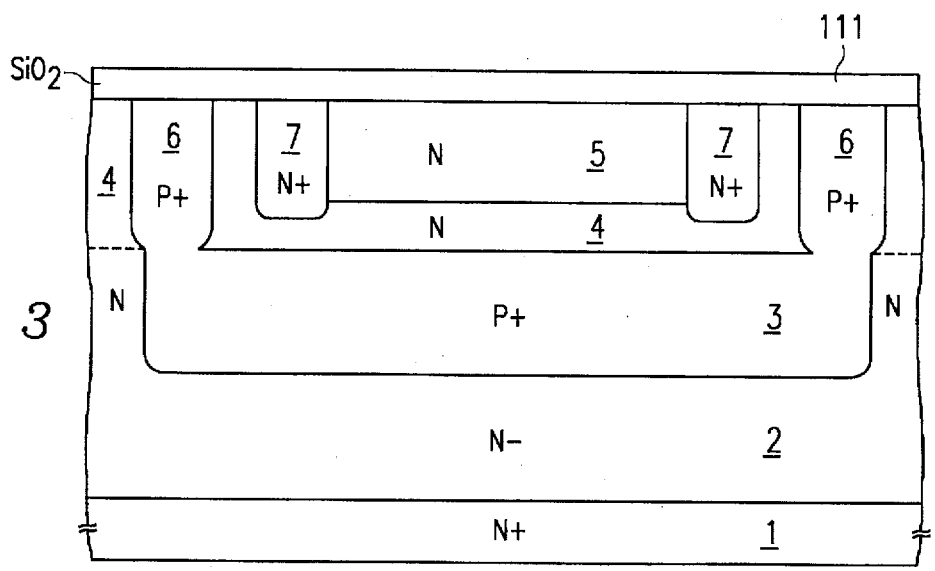
FIGS. 3 to 6 show the steps of a process of embodiment of the structure of FIG. 2.
Figure 4:
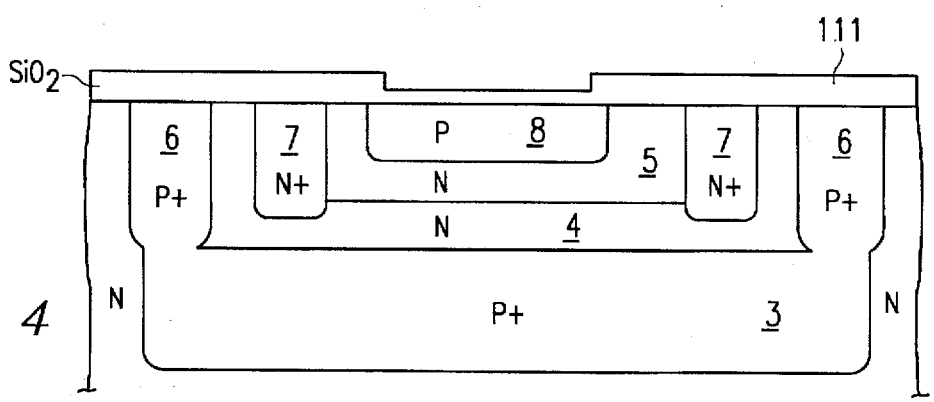

FIG. 3). In the presently preferred embodiment, this N-type layer 2 is 50 microns thick, and is doped with phosphorus to a bulk resistivity of about 50 Ω-cm; but of course other doping levels can be used. However, note that this is preferably a lower doping level than that of substrate 1.

III. Patterned implantation of P-type dopant into epitaxial layer 2. In the presently preferred embodiment, this implant is performed using sequential doses of $5 \cdot 10^{13}$ $cm^{-2}$ of boron at 100 KeV; but of course other doping levels can be used.

IV. Diffusion of the P-type dopant, introduced in step III above, to create a buried P-type region: 4' designed to act as a horizontal insulation region of the control circuit (FIG. 3). In the presently preferred embodiment, this diffusion step is performed for 300 minutes in a reducing atmosphere at a maximum temperature of 1250° C. (not counting ramp-up and ramp-down times); but of course other time and temperature specifications can be used.

V. Growth of a second epitaxial layer 5, to a thickness of 15 microns, doped with phosphorus to an average bulk resistivity of about 50 Ω-cm.

VI. Implantation and subsequent diffusion of type N dopant to create the N-well 5'(FIG. 3). In the presently preferred embodiment, this implant is performed using implantation of $10^{13}$ $cm^{-2}$ of phosphorus at 120 KeV, but of course other doping levels can be used.

VII. Patterned implantation and subsequent diffusion of P-type dopant to define the guard ring regions 6. The regions 6, together with buried layer 4', completely enclose a portion of the N-type epitaxial layer 5.

VIII. Patterned implantation and subsequent diffusion of type N dopant to provide the regions 7 of type N channel-stop (FIG. 3). In the presently preferred embodiment, this implant is performed using implantation of $10^{15}$ $cm^{-2}$ of phosphorus at 80 KeV; but of course other doping levels can be used.

IX. Oxidation of the whole surface, to form the layer of $SiO_2$ indicated by reference number 111 in FIG. 3. In the presently preferred embodiment, this $SiO_2$ layer is 1 micron thick, but of course other thicknesses can be used.

X. A masked etch is then use to open a window in oxide layer 111. This window provides a mask for implantation and diffusion of P-type dopant for formation of the base region 8 (seen in FIG. 4). In the presently preferred embodiment, this implant is performed using $2 \cdot 10^{13}$ cm$^{-2}$ of B at 80 KeV, but of course other doping levels can be used.

Figure 5:
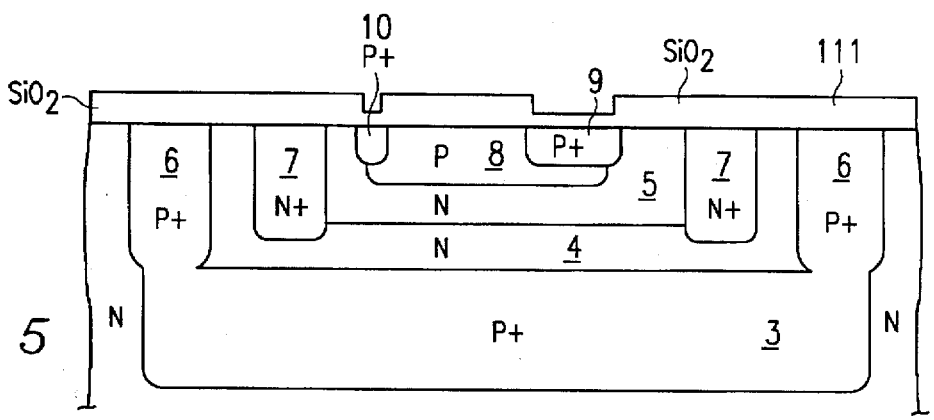

XI. Formation of a P-type region with annular geometry (following the perimeter of the base region 8 formed in step X), for definition of the base contact (and channel-stop) region 9 and channel-stop region 10 (FIG. 5). In the presently preferred embodiment, this implant is performed using $5 \cdot 10^{16}$ cm$^{-2}$ of B at 100 KeV, but of course other doping levels can be used.

Figure 6:
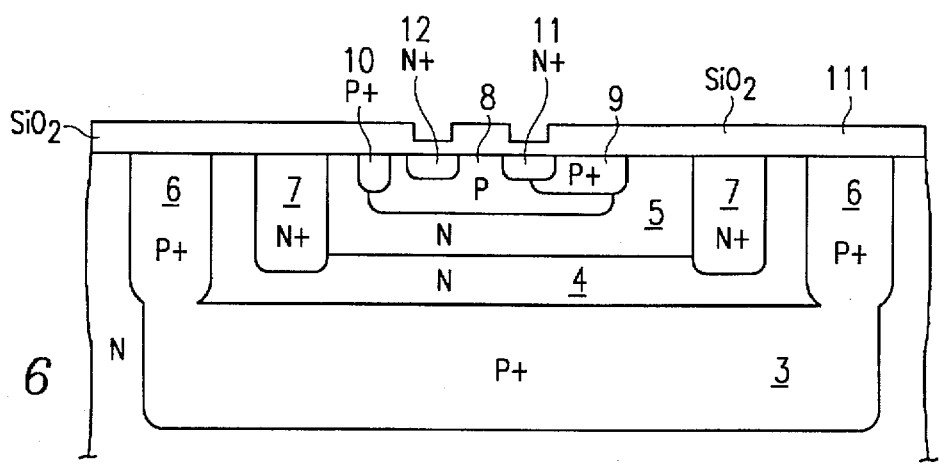

XII. Opening of two windows in the base region, implantation and activation of type N dopant for formation of the emitter region 11 and collector region 12 (FIG. 6). In the presently preferred embodiment, this implant is performed using $5 \cdot 10^{15}$ cm$^{-2}$ of arsenic at 80 KeV, to produce a junction depth of about 1 micron.

The latter step is followed by definition of the contact areas and metallization of the front and back of the slice.

Between the above steps III and IV there is normally inserted a step of implantation and subsequent diffusion of a type N dopant to provide a buried type N layer designed for the embodiment of other components in the control circuit and provided in accordance with the known art. (Thus, it should be noted that this integrated circuit structure includes both N-type and P-type buried layers.)

Figure 7:
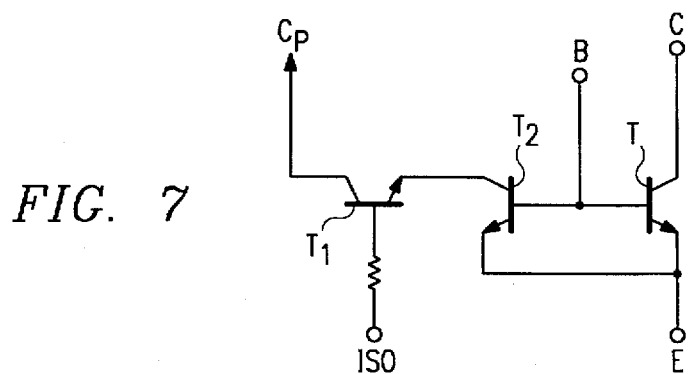
FIG. 7 shows the equivalent circuit of the structure of FIG. 2.

FIG. 7 shows the equivalent electrical diagram of the embodied structure. T represents therein the npn lateral transistor which is provided by the present invention, T1 the parasitic npn transistor (whose collector, base and emitter regions consist of the regions 1+2, 4'+6, and 5+5'+7 respectively of FIG. 2), and T2 the associated vertical npn transistor (whose collector, base and emitter regions consist of the regions 5', 8 and 11 respectively).

An important advantage of the disclosed innovations is the enormous reduction of current gain of the parasitic npn transistor (which is equal to the product of the injection efficiency and the transport factor in the base).

Indeed, both the injection efficiency (since the emitter region is of type N instead of N+) and the transport factor in the base are reduced, since the quantity of electrically active dopant contained in this region is considerably increased following elimination of the buried type N layer (region 3 of FIG. 1a).

The latter circumstance is also extremely useful in reduction of the base resistance, which also minimizes potential drops resulting from the passage of current and hence the probability of active region polarization of the parasitic npn transistor. Finally, again for the same reasons, the gain of the reverse npn parasitic transistor (i.e. the gain obtained from the same structure when the emitter and collector terminal connections are reversed), is substantially reduced.

A further class of innovative embodiments provides a selective enrichment of the base region around the emitter. This provides the advantages of:

limitation of the gain of the associated vertical npn transistor (see FIG. 7 again), increase in the early voltage $V_{early}$, minimization of the distance of the emitter and collector regions necessary to avoid punch-through, creation of a concentration gradient in the base to improve the gain characteristics, current range and frequency response.

In the process which is provided by this variation, the emitter region and the base region surrounding the emitter can be self-aligned.

Figure 8:
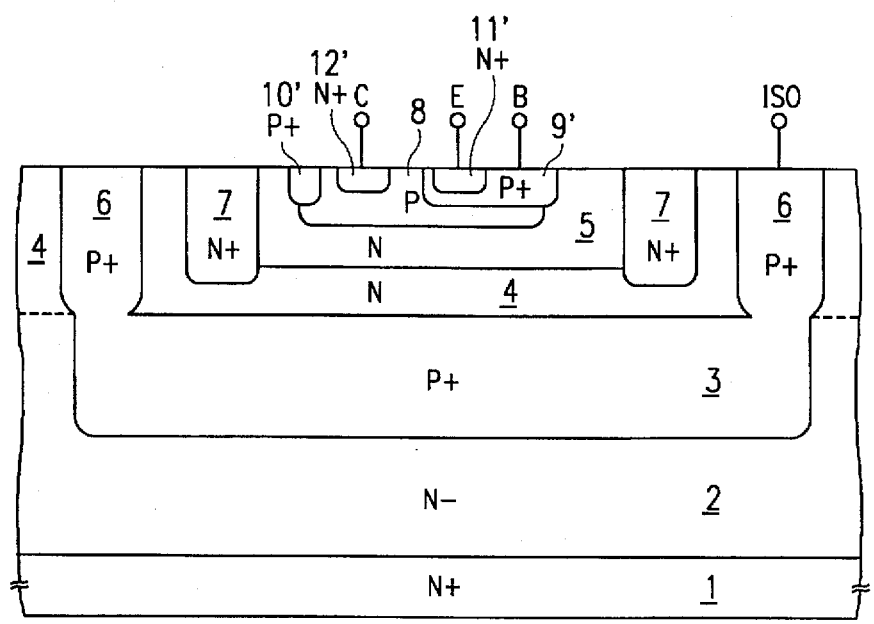
FIG. 8 shows the structure of a second example of a monolithic semiconductor device in accordance with the present invention.

The structure of the lateral npn transistor with base enrichment around the emitter is shown in FIG. 8.

Figure 9:
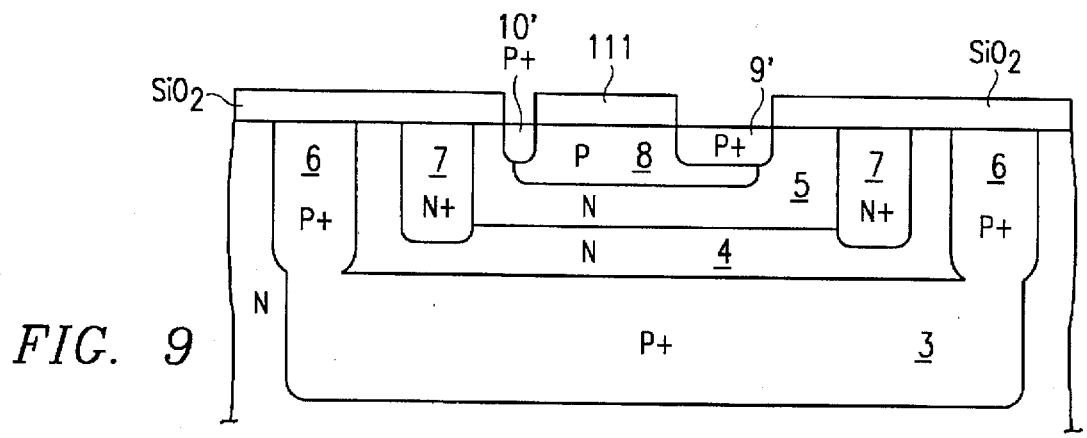
FIGS. 9–12 show key steps of a process for realizing the structure of FIG. 8.

A possible sequence of the process which is provided by this variation is illustrated in FIGS. 9 to 12. The process coincides with that previously described for the structure of FIG. 3 in the first steps and specifically steps I to IX. As concerns the subsequent steps it continues as follows:

IX.' Definition and implantation of a P-type region with annular geometry following the perimeter of the base region 8 defined in the previous step 8 for embodiment of the region 9' for base and channel stop contact, and channel stop 10' (FIG. 9).

Figure 10:
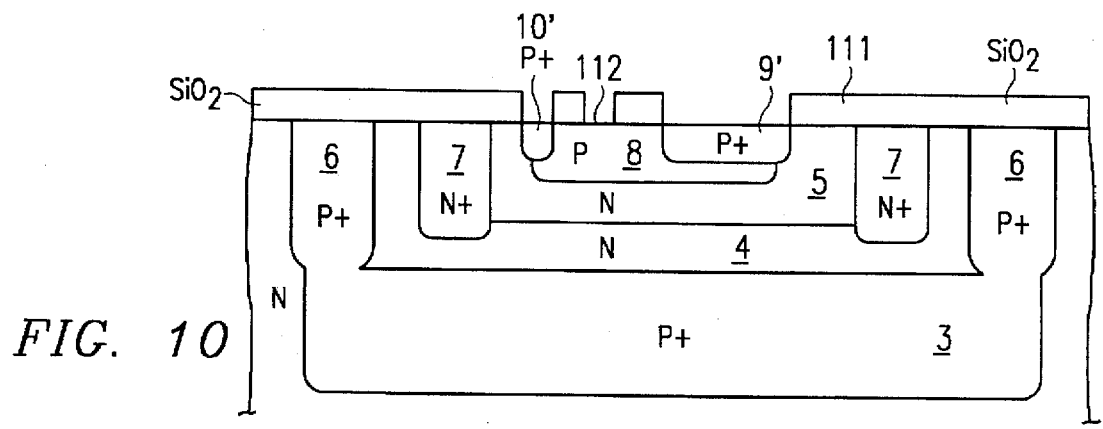
Figure 11:
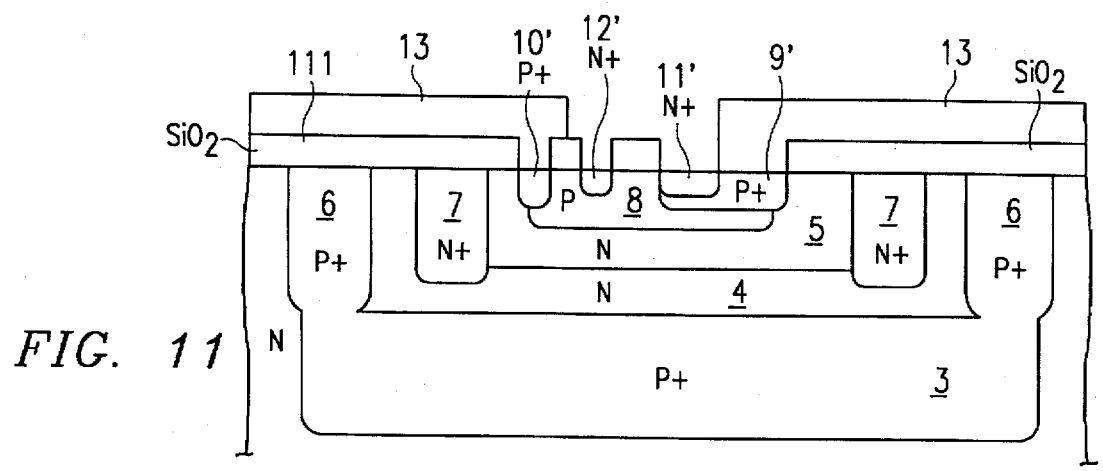

X.' Definition of a window 112 in the layer 111 of SiO$_2$ overlying the base region defined in the above step 8 for formation of the collector region (FIG. 10).

Figure 12:
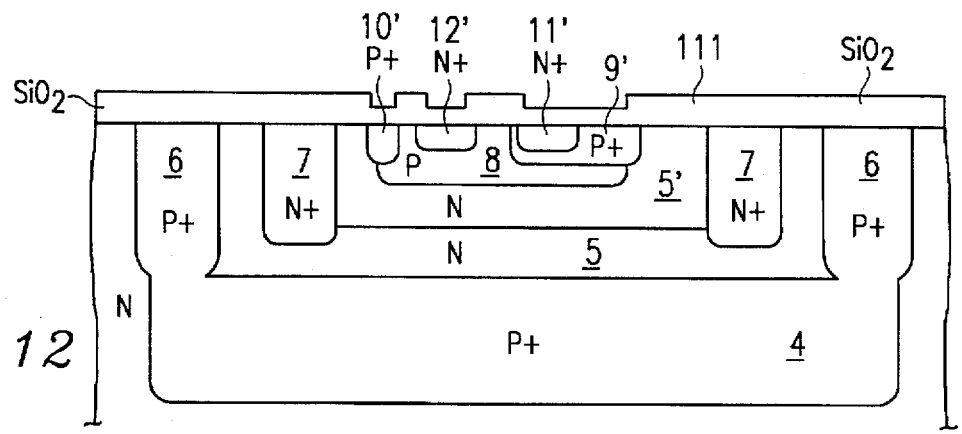

XI.' Definition and implantation through resist (layer 13) and the oxide layer (layer 111) of two type N regions for formation of the emitter region 11' and the collector region 12' (FIG. 11), and XII.' Removal of the layer 13 of resist, diffusion of the emitter and collector regions and base enrichment (FIG. 12).

There follow definition of the contact areas and metallization of the front and back of the slice.

Figure 13:
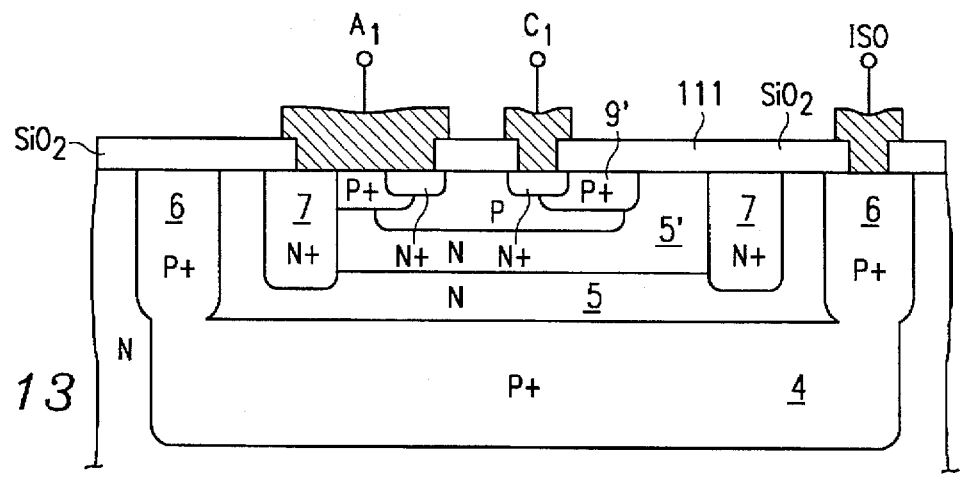
FIG. 13 shows the structure of a third example of a monolithic semiconductor device in accordance with the present invention.

As shown in FIG. 13 the structure in accordance with the present invention in its main embodiment as well as in the variation described can be used for the integration of diodes.

In this case the base and collector regions are short-circuited with the epitaxial layer so as to prevent current injection on the insulation region (A1 and C1 in FIG. 13 represent the anode and cathode of the integrated diode).

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A fabrication method, comprising the steps of:
   (a.) providing a substrate which includes at least one substantially monocrystalline body of semiconductor material, and which has a net N-type doping concentration at at least a first surface thereof;
   (b.) introducing P-type dopant atoms in a predetermined pattern into said substrate to create P-type (buried) regions therein;
   (e.) epitaxially growing an additional thickness of semiconductor material on said first surface, to form an N-type layer overlying said P-type buried regions;
   (d.) introducing and activating dopant atoms, to form at least one P-type guard ring region which extends from said first surface to contact a respective one of said P-type buried regions and totally enclose a respective portion of said N-type layer;

(e.) introducing and activating dopant atoms, to form at least one N-type guard ring region, within a respective enclosed portion of said N-type layer, which extends from said first surface to a depth less than that of said P-type guard ring regions;

(f.) introducing P-type dopant atoms, to form at least one base region, within a respective enclosed portion of said N-type layer, which extends from said first surface to a depth less than that of said N-type guard ring regions; and (g.) introducing N-type dopant atoms, to form an emitter region, and a collector region laterally separated from said emitter region, within a respective one of said base regions.

2. The method of claim 1, further comprising the preliminary step, prior to said step (a), of epitaxially growing N- on N-type semiconductor material to form said substrate.

3. The method of claim 1, further comprising the additional step, after said step (17.c) and before said step (17.f), of introducing an additional concentration of N-type dopant atoms to form at least one N-well region which is laterally abutted by a respective one of said N-type guard ring regions.

4. The method of claim 1, further comprising the additional step, after said step (17.e) and before said step (17.g), of introducing an additional concentration of P-type dopant atoms to form an annular base contact region which laterally abuts a respective one of said base regions.

5. The method of claim 1, further comprising the additional step, after said step (17.e) and before said step (17.g), of introducing an additional concentration of P-type dopant atoms to form an annular base contact region which laterally abuts a respective one of said base regions, and which laterally extends to surround the junction between said emitter and said base.

6. The method of claim 1, wherein said semiconductor material consists essentially of silicon.

7. The method of claim 1, further comprising the additional step of fabricating a power transistor in said substrate.

8. The method of claim 1, further comprising the additional step of fabricating a vertical bipolar power transistor in said substrate.

9. A method, comprising the steps of:

(a.) providing a substrate which includes at least one substantially monocrystalline body of semiconductor material, and which has a net N-type doping concentration at at least a first surface thereof;

(b.) introducing P-type dopant atoms in a predetermined pattern into said substrate to create P-type buried regions therein;

(c.) epitaxially growing an additional thickness of semiconductor material on said first surface, to form an N-type layer overlying said P-type buried regions;

(d.) introducing and activating dopant atoms, to form at least one P-type guard ring region which extends from said first surface to contact a respective one of said P-type buried regions and totally enclose a respective portion of said N-type layer;

(e.) introducing and activating dopant atoms, to form at least one N-type guard ring region, within a respective enclosed portion of said N-type layer, which extends from said first surface to a depth less than that of said P-type guard ring regions;

(f.) introducing P-type dopant atoms, to form at least one base region, within a respective enclosed portion of said N-type layer, which extends from said first surface to a depth less than that of said N-type guard ring region, and is totally surrounded by said N-type guard ring region;

(g.) introducing N-type dopant atoms, to form an emitter region, and a collector region laterally separated from said emitter region, within a respective one of said base regions; and (h.) introducing P-type dopant atoms, to form a base contact diffusion which totally laterally surrounds said emitter and collector regions, and which provides contact to said base region.

10. The method of claim 9, further comprising the preliminary step, prior to said step (a), of epitaxially growing N- on N-type semiconductor material to form said substrate.

11. The method of claim 9, further comprising the additional step, after said step (c) and before said step (f), of introducing an additional concentration of N-type dopant atoms to form at least one N-well region which is laterally abutted by a respective one of said N-type guard ring regions.

12. The method of claim 9, further comprising the additional step, after said step (e) and before said step (g), of introducing an additional concentration of P-type dopant atoms to form an annular base contact region which laterally abuts a respective one of said base regions.

13. The method of claim 9, further comprising the additional step, after said step (e) and before said step (g), of introducing an additional concentration of P-type dopant atoms to form an annular base contact region which laterally abuts a respective one of said base regions, and which laterally extends to surround the junction between said emitter and said base.

14. The method of claim 9, wherein said semiconductor material consists essentially of silicon.

15. The method of claim 9, further comprising the additional step of fabricating a power transistor in said substrate.

16. The method of claim 9, further comprising the additional step of fabricating a vertical bipolar power transistor in said substrate.

17. A method, comprising the steps of:

(a.) providing a substrate which includes at least one substantially monocrystalline body of semiconductor material, and which has a net doping concentration of a first conductivity type at at least a first surface thereof;

(b.) introducing second-conductivity-type dopant atoms in a predetermined pattern into said substrate to create second-conductivity-type buried regions therein;

(c.) epitaxially growing an additional thickness of semiconductor material on said first surface, to form a first-conductivity-type layer overlying said second-conductivity-type buried regions;

(d.) introducing and activating dopant atoms, to form at least one second-conductivity-type guard ring region which extends from said first surface to contact a respective one of said second-conductivity-type buried regions and totally enclose a respective portion of said first-conductivity-type layer;

(e.) introducing and activating dopant atoms, to form at least one first-conductivity-type guard ring region, within a respective enclosed portion of said first-conductivity-type layer, which extends from said first surface to a depth less than that of said second conductivity-type guard ring regions;

(f.) introducing second-conductivity-type dopant atoms, to form at least one base region, within a respective enclosed portion of said first-conductivity-type layer, which extends from said first surface to a depth less than that of said first-conductivity-type guard ring regions; and (g.) introducing first-conductivity-type dopant atoms, to form an emitter region, and a collector region laterally separated from said emitter region, within a respective one of said base regions.

18. The method of claim 17, further comprising the preliminary step, prior to said step (a), of epitaxially growing said substrate.

19. The method of claim 17, further comprising the additional step, after said step (c) and before said step (f), of introducing an additional concentration of N-type dopant atoms to form at least one N-well region which is laterally abutted by a respective one of said N-type guard ring regions.

20. The method of claim 17, further comprising the additional step, after said step (e) and before said step (g), of introducing an additional concentration of P-type dopant atoms to form an annular base contact region which laterally abuts a respective one of said base regions.

21. The method of claim 17, further comprising the additional step, after said step (e) and before said step (g), of introducing an additional concentration of P-type dopant atoms to form an annular base contact region which laterally abuts a respective one of said base regions, and which laterally extends to surround the junction between said emitter and said base.

22. The method of claim 17, wherein said semiconductor material consists essentially of silicon.

23. The method of claim 17, further comprising the additional step of fabricating a power transistor in said substrate.

24. The method of claim 29, further comprising the additional step of fabricating a vertical bipolar power transistor in said substrate.

* * * * *